(12) United States Patent
Mahoney

(10) Patent No.: US 7,182,638 B2
(45) Date of Patent: Feb. 27, 2007

(54) MOUNTING TABS ARRANGEMENT

(75) Inventor: William G. Mahoney, Suwanee, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 352 days.

(21) Appl. No.: 10/838,630

(22) Filed: May 4, 2004

(65) Prior Publication Data
US 2005/0250380 A1 Nov. 10, 2005

(51) Int. Cl.
H01R 13/73 (2006.01)
(52) U.S. Cl. .................... 439/564; 439/579
(58) Field of Classification Search ............ 439/564, 439/565, 538, 535, 579; 174/48, 480–489; D13/154, 151
See application file for complete search history.

(56) References Cited

U.S. PATENT DOCUMENTS

| 4,328,903 A | * | 5/1982 | Baars | 220/3.7 |
| 5,055,056 A | | 10/1991 | Auclair et al. | 439/98 |
| 5,364,281 A | | 11/1994 | Leto | 439/100 |
| 5,906,512 A | * | 5/1999 | Reynolds | 439/579 |
| 6,559,381 B2 | * | 5/2003 | Shotey et al. | 174/66 |
| D506,445 S | * | 6/2005 | Mahoney | D13/154 |
| D521,939 S | * | 5/2006 | Mahoney | D13/151 |
| 2003/0192063 A1 | * | 10/2003 | Runkle | 725/149 |

* cited by examiner

Primary Examiner—Tho D. Ta
Assistant Examiner—Vanessa Girardi

(57) ABSTRACT

A mounting tab arrangement for mounting a housing assembly. The housing assembly includes a plurality of connectors extending from the housing assembly and a plurality of mounting tabs extending from the housing assembly. Each of the mounting tabs extends between a pair of adjacent connectors. However, the mounting tabs do not extend out beyond distal ends of the connectors. In one embodiment, each of the mounting tabs includes a slot where the slots are oriented in different directions relative to one another so that the housing assembly can be variably mounted despite the distal ends of the connectors extending beyond the mounting tabs.

9 Claims, 6 Drawing Sheets

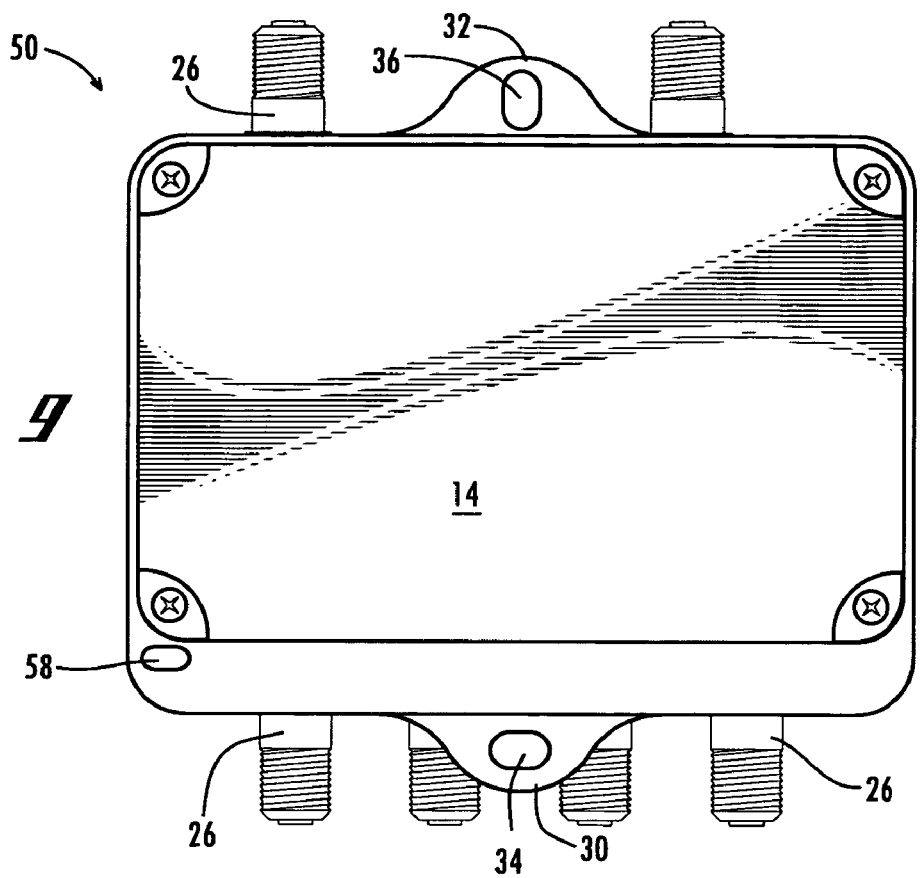
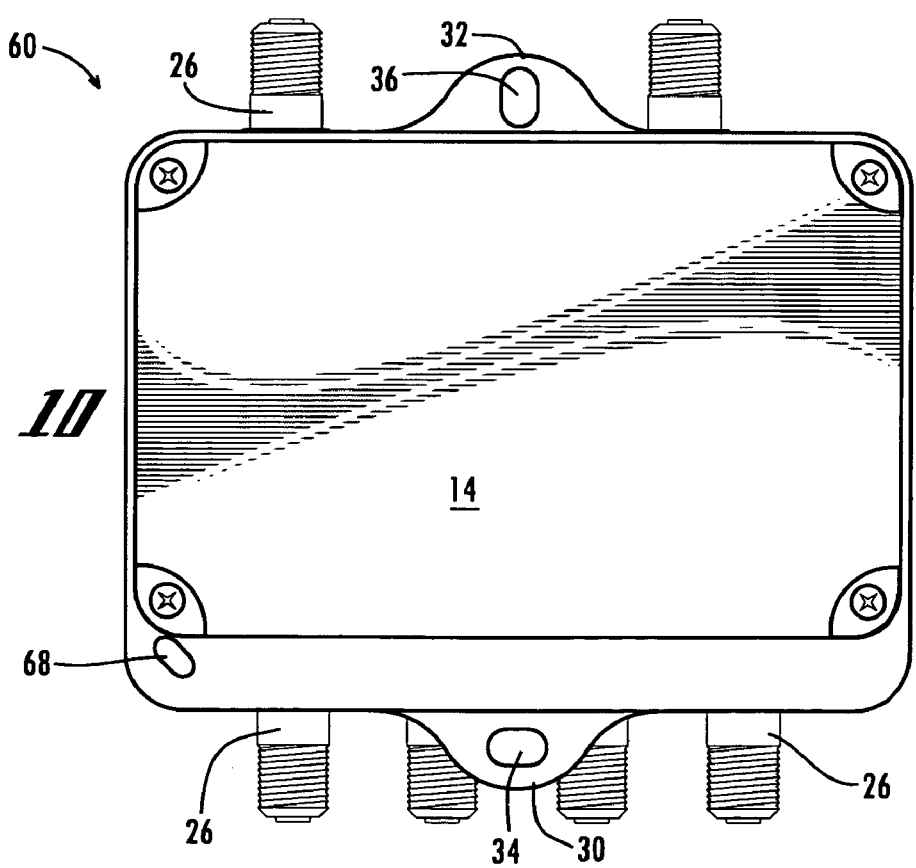

MOUNTING TABS ARRANGEMENT

CROSS REFERENCE TO RELATED APPLICATIONS

The present U.S. utility application is related to U.S. design application entitled "HOUSING ASSEMBLY SURFACE CONFIGURATION", (A-9866), U.S. design application entitled "HOUSING ASSEMBLY WITH GROUND WIRE CONNECTION", (A-9870), to U.S. design application entitled "GROUND WIRE CONNECTION PORTION", (A-9927), and to U.S. utility application entitled "INDICATOR FOR MOUNTING GROUND WIRE", (A-9868), all to the same inventor, which are incorporated herein by reference, and having been filed concurrently with the present application.

TECHNICAL FIELD

The present invention relates to housing assemblies and, more particularly, relates to the arrangement of the mounting tabs extending from a housing assembly to economize space.

BACKGROUND OF THE INVENTION

There are many types of housing assemblies available today. Many of the housings define an interior for electronic circuitry that is to be protected from the exterior environment. Also, many of the housing assemblies require mounting tabs so that the housing assembly may be securely mounted to a surface such as a vertical wall. Typically, one or more mounting tabs extend outward from the exterior surface of the housing assembly. In particular, the mounting tabs extend from the outermost periphery of the housing assembly and, therefore, undesirably define an oversized footprint of the housing assembly. Therefore, today's housing assemblies do not economize space because the mounting tabs define the outermost point beyond the exterior surface of the housing assembly.

What is needed is a mounting tab arrangement suitable for mounting housing assemblies in an economy of space. In particular, the mounting tabs must be arranged within the confines of other features of the housing assembly while still permitting easy attachment of the housing assembly.

BRIEF DESCRIPTION OF THE DRAWINGS

FIG. 9 is a bottom view of the housing assembly of FIG. 7.

FIG. 10 is a bottom view of the housing assembly of FIG. 8.

DETAILED DESCRIPTION

Figure 1:
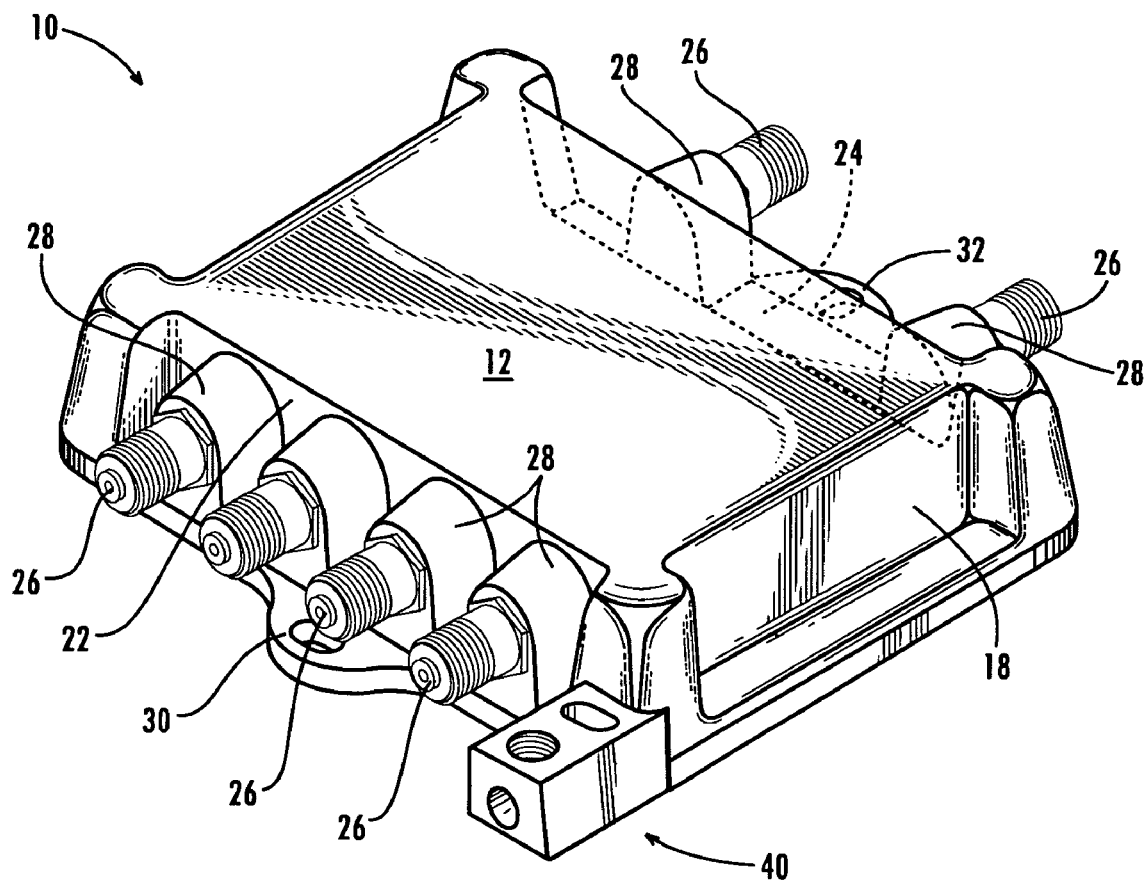
FIG. 1 illustrates a top perspective view of one embodiment of a housing assembly of the present invention having an indicator for mounting a ground wire.
Figure 2:
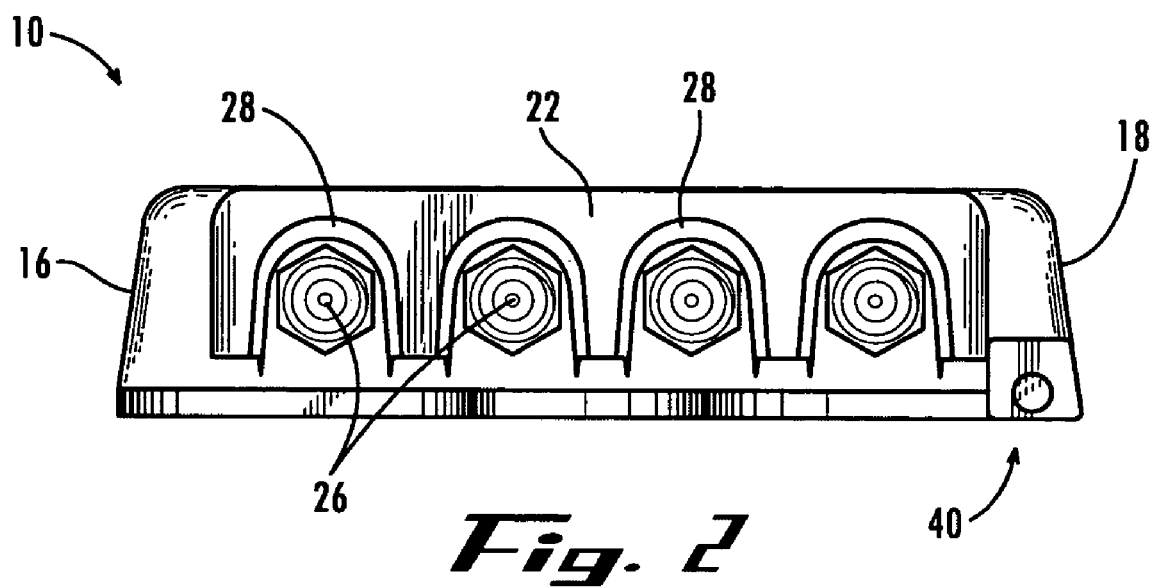
FIG. 2 is a front view of the housing assembly of FIG. 1.
Figure 3:
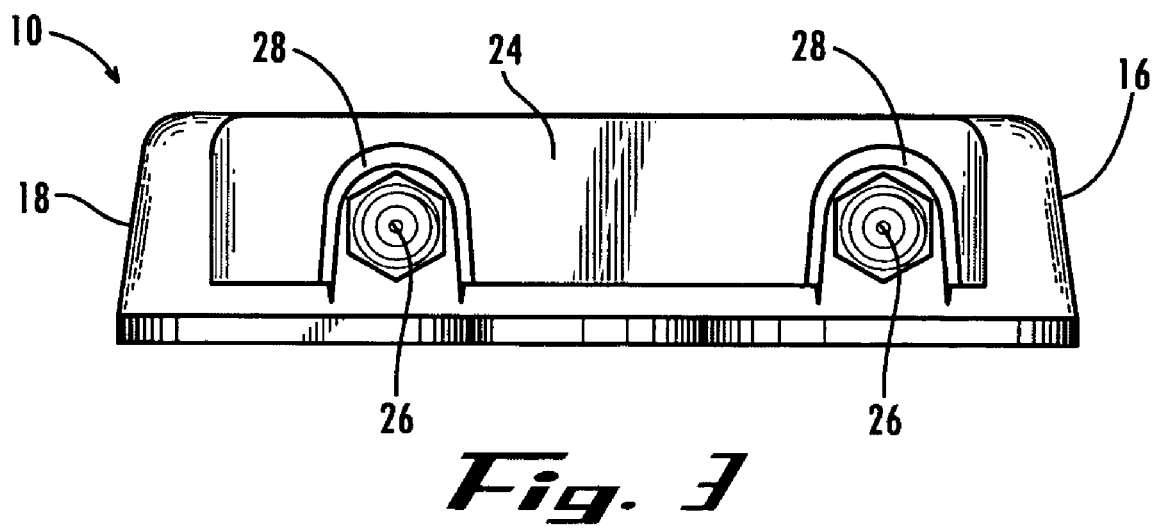
FIG. 3 is a back view of the housing assembly of FIG. 1.

The present invention solves the above-identified problem by providing a housing assembly 10 configured to economize space by reorienting the mounting tabs and limiting the extent which the mounting tabs extend outward while still allowing the housing assembly 10 to be variably mounted to a surface. Referring now to the drawings in which like numerals indicate like elements throughout the several views, FIGS. 1–6 illustrate an exemplary embodiment of the housing assembly 10 of the present invention.

In one embodiment, the housing assembly 10 includes an interior space defined by top 12, bottom 14, opposing sides 16 and 18, and opposing ends 22 and 24. The housing assembly 10 may be made of any material suitable for providing structural support and protecting for the interior of the housing assembly 10 from the exterior environment. For example, the interior of the housing assembly 10 may include electronics.

Preferably, the housing assembly 10 is two different die cast parts where a face plate or top half (top 12, opposing sides 16 and 18, and opposing ends 22 and 24) packages circuitry and a back cover or lower half (bottom 14) are combined to seal the circuitry from the exterior environment. Also, as best shown in FIG. 1, the sides 16, 18 and ends 22, 24 include recessed portions in order to make the wall thickness constant throughout the face plate and, therefore, make the housing assembly 10 more easily castable.

The housing assembly 10 may include any number of connectors 26. The number and arrangement of connectors 26 is dependent upon the purpose of the housing assembly 10 and the circuitry within the housing assembly 10. Each of the projecting portions of the housing assembly 10 from which the connectors 26 extend may be referred to as a boss 28. A bore of each boss 28 supports a corresponding connector 26.

Figure 4:
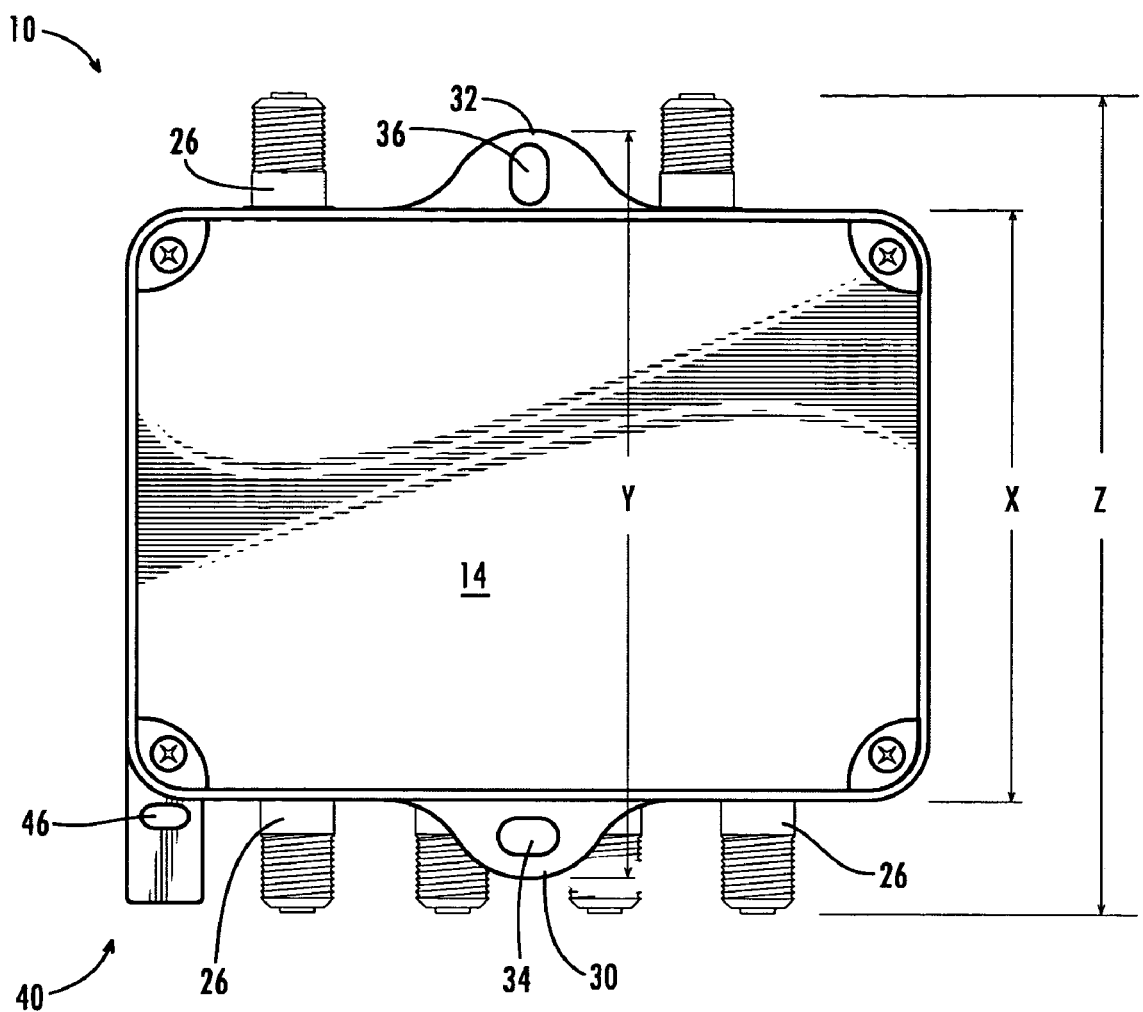
FIG. 4 is a bottom view of the housing assembly of FIG. 1.

As best shown in FIG. 4, the housing assembly 10 includes mounting tabs 30 and 32 with slots 34 and 36, respectively. Each of the slots 34 and 36 are preferably elongated in different directions so that one of the slots provides for horizontal adjustments and the other slot provides for vertical adjustments when the housing assembly 10 is mounted to a surface such as a vertical wall. For example, the slot 34 of mounting tab 30 is elongated in a direction substantially parallel to the side 22 of the housing assembly 10 and the slot 36 is elongated in a direction substantially perpendicular to the side 24 of the housing assembly 10.

The size and location of mounting tabs often interfere with mounting a housing assembly with connectors. Typically, the size of the mounting tabs increase with the size of the housing assembly. The footprint of a housing assembly is often then decided by the mounting tabs rather than the connectors. However, as best shown in FIG. 4, each of the mounting tabs 30, 32 are mounted in between a pair of adjacent connectors 26 so that the distal ends of the connectors 26 define the footprint of the housing assembly 10 and that the housing assembly 10 is then configured in an economy of space. Preferably, the housing assembly 10 is free from mounting tabs outside the confines of a pair of adjacent connectors 26. Therefore, the number of connectors on a housing assembly may be increased without having to relocate or reorient the mounting tabs. Any number of connectors 26 may be utilized on either side of the mounting tabs 30, 32.

Preferably, each of the mounting tabs 30, 32 extend outward from the top half of the housing assembly 10 between the innermost pair of connectors 26. Therefore, slot 34 is elongated to extend between the innermost pair of connectors 26. However, each of the mounting tabs 30, 32 preferably do not extend out beyond the distal ends of the connectors 26. Also, either or both of the mounting tabs 30, 32 may be oriented closer to one connector than the other of the innermost pair of connectors 26. For example, as shown in FIG. 4, the mounting tab 32 is closer to the connector 26 on its right than to the connector 26 on its left.

As shown in FIG. 4, the dimension of the top half or the housing 10 without the connectors 26 is X. The dimension between distal ends of opposing connectors 26 is Z. The dimension between the two mounting tabs 30, 32 is Y. The dimension X is less than the dimension Z because the connectors 26 protrude from the ends 22, 24 of the housing 10. The dimension Y is preferably less than the dimension Z, but the dimension Y may instead be equal to the dimension Z. Therefore, in the present invention x<Y≦Z.

Figure 5:
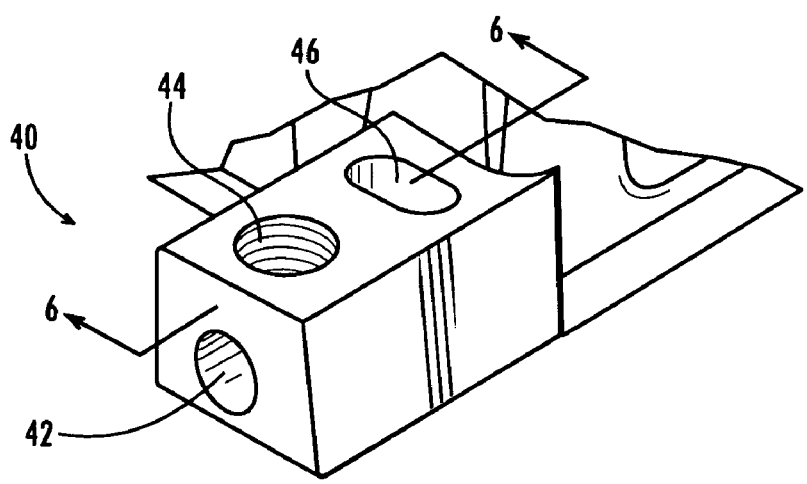
FIG. 5 is a close-up perspective view of the mounting indicator of the housing assembly of FIG. 1.

The housing assembly 10 may also include an indicator for indicating when a wire is properly secured to the housing assembly 10. The indicator may be an elongated portion 40 extending from the top half of the housing assembly 10 as shown in FIGS. 1 and 4. Preferably, the elongated portion 40 is aligned with an edge of the housing assembly 10 such as the edge defined by the side 18 of the housing assembly 10. As best shown in FIG. 5, an opening 42 for receiving the wire extends inward from a distal end of the elongated portion 40. Therefore, the opening 42 itself may be referred to as being aligned with an edge of the housing 10.

Figure 6:
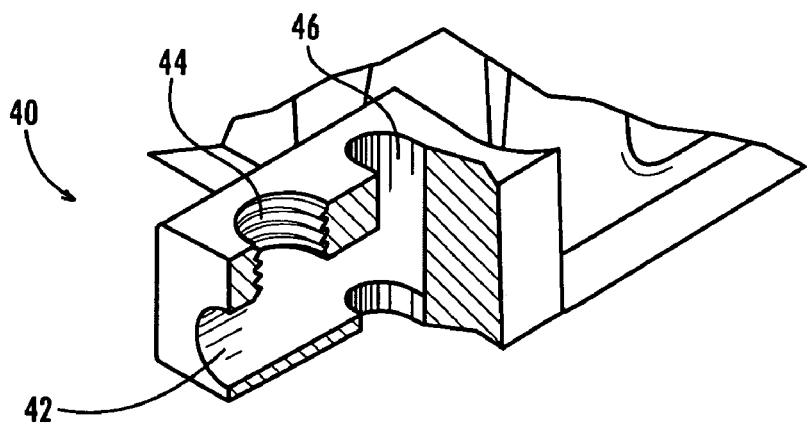
FIG. 6 is a cross-section view of the mounting indicator of FIG. 5.

Another opening 44 is oriented at an angle to the opening 42. As best shown in FIG. 6, the opening 44 is axially directed relative the opening 42 and therefore intersects with the opening 40. A retaining means (not shown) such as a threaded fastener is received into the second opening 44 to mechanically retain the wire in the opening 42. Once the wire is within the opening 42, the wire may be secured in the opening 42 by tightening the threaded fastener in the opening 44. By tightening the threaded fastener in the opening 44, the distal end of the threaded fastener pins the wire against the inside of the opening 42 thereby mechanically holding the wire within the opening 42.

Still referring to FIGS. 5 and 6, the elongated portion 40 also includes yet another opening 46 that is preferably somewhat obround-shaped. The opening 46 is configured to permit a portion of the wire received in opening 42 to be viewed from the exterior of the elongated portion 40 of the housing assembly 10. The shape of the opening 46 is dependant upon the view desired of the wire within the opening 42. The opening 46 is laterally displaced from the opening 44 along the elongated portion 40. The opening 46 is also oriented at an angle to the opening 46. Both the opening 44 and the opening 46 extend inward from the exterior of the elongated portion 40 to the opening 42 and, therefore, are axially directed relative the opening 42.

However, the opening 44 is placed in between the opening 46 and the distal end of the elongated portion where the wire is inserted into the opening 42. When the wire is received in the opening 42, the distal end of the wire may then be viewed through the opening 46. Preferably, the opening 46 extends completely through the elongated portion 40 and intersects with the opening 42 so that the wire may be viewed through either end of the opening 46. The wire preferably does not extend through the opening 46. FIG. 4 best illustrates the opening 46 intersecting with the end of the opening 42 and then extending completely through the elongated portion 40 to the bottom of the housing assembly 10. However, it is preferred that the opening 44 does not extend completely through the elongated portion 40, as does opening 46, because the threaded fastener only needs to pin the wire against the inside of the opening 42 without pushing the wire though the opening 44.

Figure 7:
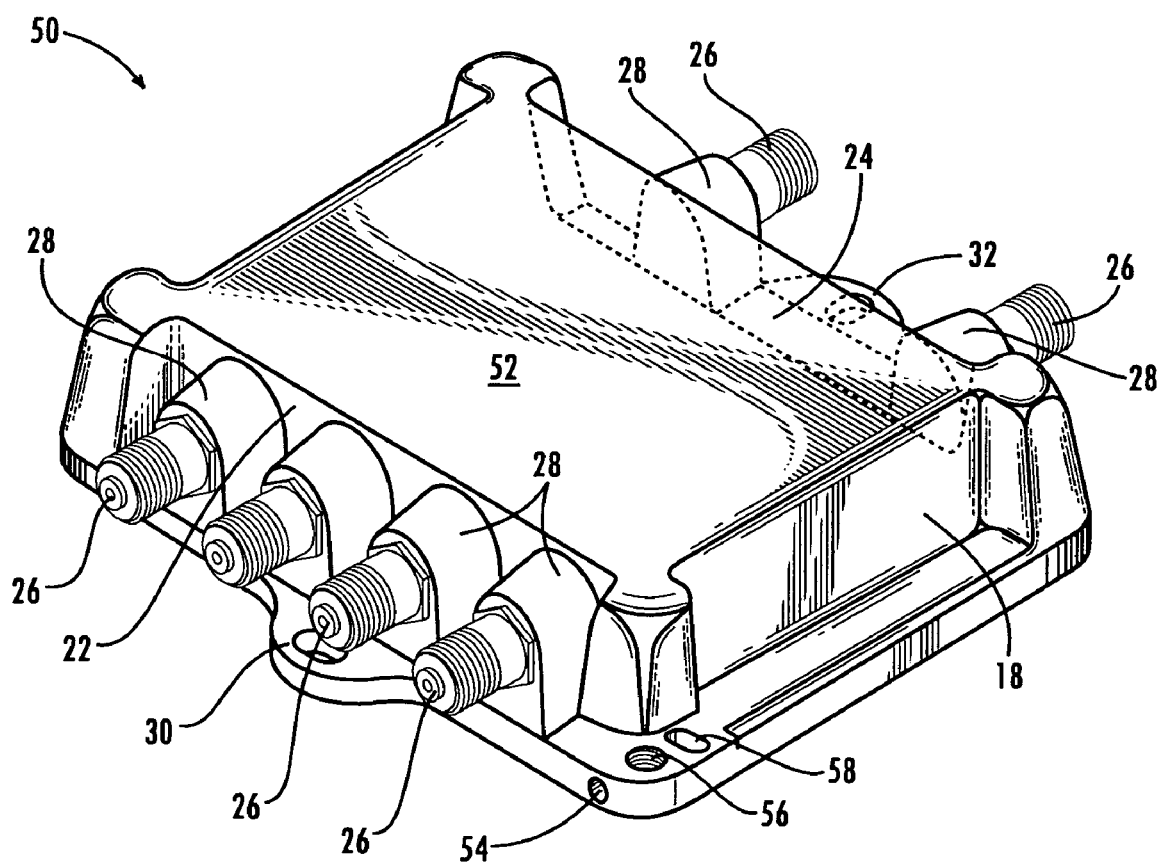
FIG. 7 illustrates a top perspective view of an alternative embodiment of a housing assembly of the present invention having an indicator for mounting a ground wire.
Figure 8:
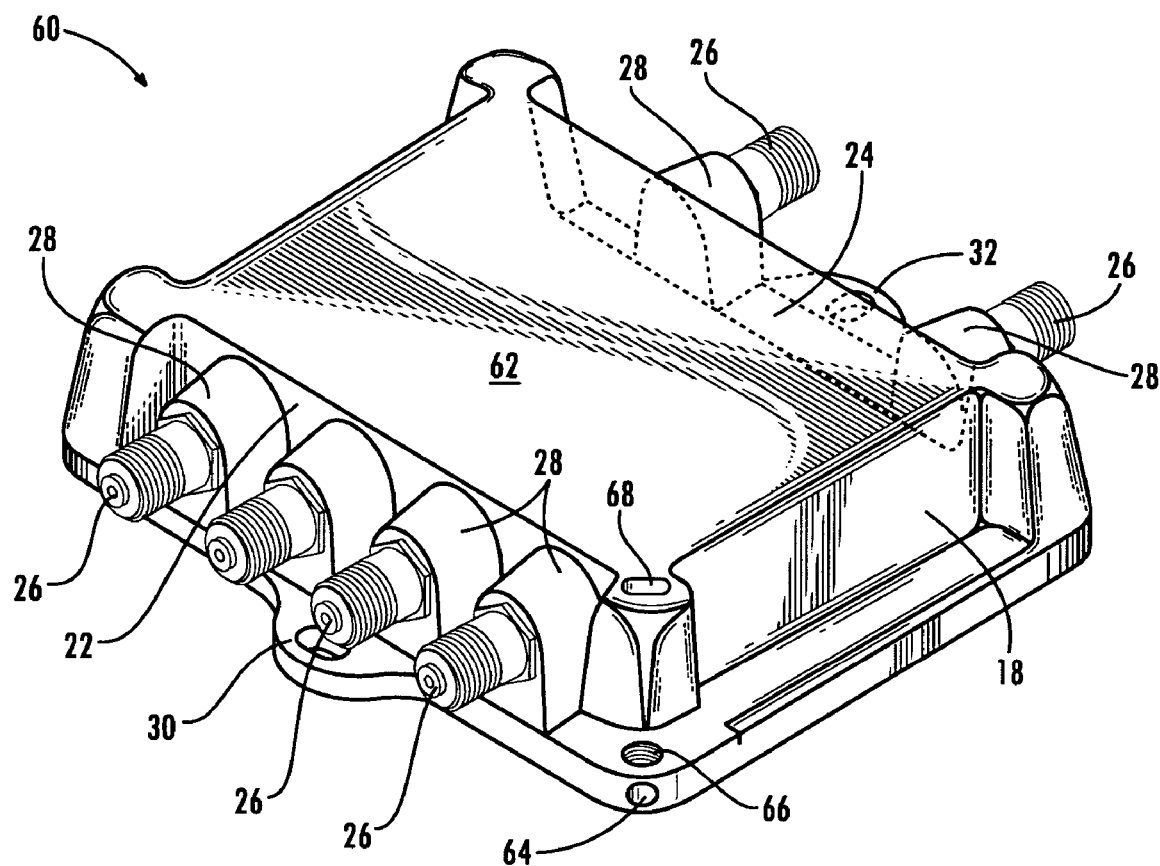
FIG. 8 illustrates a top perspective view of another alternative embodiment of a housing assembly of the present invention having an indicator for mounting a ground wire.

FIGS. 7 and 8 illustrate alternative embodiments of housing assemblies 50 and 60, respectively, of the present invention. The housing assemblies 50 and 60 are similar to the housing assembly 10 described above except that the housing assemblies 50 and 60 include top halves defined at least in part by tops 52 and 62, respectively, rather than top 12. Also, the housing assemblies 50, 60 do not include an indicator defined by an elongated portion 40, but instead allow the wire to be received directly into the top halves of the housing assemblies 50, 60.

Each of the top halves of the housing assemblies 50, 60 may include an edge portion having a thickness defined by either of the ends 16, 18 and/or either of the sides 22, 24. In FIGS. 7 and 8, a front surface of the edge portion defined by a combination of the side 18 and end 22 includes an indicator for indicating when a wire is received and properly retained within the housing assemblies 50, 60. In FIG. 7, the housing assembly 50 includes an opening 54 extending inward toward the interior of the housing assembly 50. The housing assembly 50 also includes openings 56 and 58 that are configured relative the opening 54 in a manner similar to the configuration of the openings 44 and 46 relative to the opening 42 as described above. FIG. 9 best illustrates the opening 58 extending all the way through to the bottom of the housing assembly 50 so that the distal end of the wire may be viewed from either the top or the bottom of the housing assembly 50.

In FIG. 8, the housing assembly 60 includes an opening 64 extending inward from an edge toward the interior of the housing assembly 60. The housing assembly 60 also includes openings 66 and 68 that are configured relative the opening 64 in a manner similar to the configuration of the openings 44 and 46 relative the opening 42 as described above. However, in contrast to the housing assembly 50, the opening 68 extends inward from the top 62. FIG. 10 best illustrates the opening 68 extending from the top 62 all the way through to the bottom of the housing assembly 60 so that the distal end of the wire may be viewed from either the top or the bottom of the housing assembly 60. However, in an alternative embodiment, the opening 68 may instead extend only from the bottom of the housing assembly and not from the top 62. In such case, the distal end of the wire received in opening 64 would only be viewable from the bottom of the housing assembly 60. In other alternative embodiments, openings such as openings 58 and 68 may instead extend through the bottom 14.

The foregoing has broadly outlined some of the more pertinent aspects and features of the present invention. These should be construed to be merely illustrative of some of the more prominent features and applications of the invention. Other beneficial results can be obtained by applying the disclosed information in a different manner or by modifying the disclosed embodiments. Accordingly, other aspects and a more comprehensive understanding of the invention may be obtained by referring to the detailed description of the exemplary embodiments taken in conjunction with the accompanying drawings, in addition to the scope of the invention defined by the claims.

What is claimed is:

1. A housing assembly for maximizing an interior volume while variably mounting said housing assembly in an economy of space, said housing assembly comprising:

a top, bottom, opposing sides and opposing ends, defining an interior of said housing assembly;

a plurality of connectors extending from mutually parallel external edges of said housing assembly; and a plurality of mounting tabs for variably mounting said housing assembly such that said housing assembly may be adjusted in the vertical as well as horizontal directions, said plurality of mounting tabs extending from said mutually parallel external edges of said housing, wherein each of said mounting tabs extends between a pair of adjacent said connectors extending from said mutually parallel external edges of said housing assembly, and wherein said mounting tabs extend out beyond proximal ends of said pair of adjacent connectors but do not extend out beyond distal ends of said pair of adjacent connectors, and wherein said mutually parallel external edges substantially define at least a potion of said interior of said housing assembly, thereby maximizing said interior of said housing assembly by maintaining said interior free of said mounting tabs.

2. The housing assembly of claim 1 wherein at least two of said plurality of mounting tabs oppose one another.

3. The housing assembly of claim 1 wherein each of said mounting tabs comprises a slot, one of said slots elongated in one direction and another of said slots elongated in a different direction.

4. The housing assembly of claim 1 wherein one of said slots is elongated in a direction substantially parallel to one of said sides of said housing assembly and another of said slots is elongated in a direction substantially perpendicular to the other said side of said housing assembly.

5. The housing assembly of claim 1 wherein at least one said mounting tab comprises a slot for vertical adjustments when mounting said housing assembly and at least one other said mounting tab comprises a slot for horizontal adjustments when mounting said housing assembly.

6. The housing assembly of claim 1 wherein each of said mounting tabs extends between an innermost pair of adjacent said connectors extending from said housing assembly.

7. The housing assembly of claim 1 wherein one of said mounting tabs is oriented closer to one of said connectors than another said connector of an adjacent pair of said connectors.

8. The housing assembly of claim 1 wherein said housing assembly has a dimension X, opposing said mounting tabs define a dimension Y, and said distal ends of opposing said connectors define a dimension Z, wherein X<Y≦Z.

9. The housing assembly of claim 1 wherein said housing assembly has a dimension X, opposing said mounting tabs define a dimension Y, and said distal ends of opposing said connectors define a dimension Z, wherein X<Y<Z.

* * * * *